(12) United States Patent
Li

(10) Patent No.: US 12,500,163 B2
(45) Date of Patent: Dec. 16, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Chengfeng Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 450 days.

(21) Appl. No.: 18/149,711

(22) Filed: Jan. 4, 2023

(65) Prior Publication Data
US 2024/0006306 A1  Jan. 4, 2024

Related U.S. Application Data

(63) Continuation of application No. PCT/CN2022/105486, filed on Jul. 13, 2022.

(30) Foreign Application Priority Data

Jun. 30, 2022 (CN) .......................... 202210756155.2

(51) Int. Cl.
*H01L 23/522* (2006.01)
*H01L 21/02* (2006.01)
(Continued)

(52) U.S. Cl.
CPC .... *H01L 23/5226* (2013.01); *H01L 21/02263* (2013.01); *H01L 21/30604* (2013.01);
(Continued)

(58) Field of Classification Search
CPC .......... H01L 23/5226; H01L 23/53228; H01L 23/53257; H01L 21/02263;
(Continued)

(56) References Cited

U.S. PATENT DOCUMENTS 5,286,675 A * 2/1994 Chen ................. H01L 21/76885
438/782
5,907,787 A 5/1999 Sato
(Continued)

FOREIGN PATENT DOCUMENTS

| CN | 102184842 A | 9/2011 |
|---|---|---|
| CN | 103646874 A | 3/2014 |

(Continued)

OTHER PUBLICATIONS

International Search Report cited in PCT/CN2022/105486 mailed Dec. 22, 2022, 9 pages.

*Primary Examiner* — Tu-Tu V Ho
(74) *Attorney, Agent, or Firm* — Kilpatrick Townsend & Stockton LLP

(57) ABSTRACT

The present disclosure provides a semiconductor structure and a manufacturing method thereof. The manufacturing method includes: providing a substrate; and forming a first metal via structure, where the first metal via structure is provided in the substrate, and a top surface of the first metal via structure is flush with a top surface of the substrate, where the top surface of the first metal via structure is made flush with the top surface of the substrate through at least a first process and a second process.

17 Claims, 12 Drawing Sheets

(51) Int. Cl.
  *H01L 21/306* (2006.01)
  *H01L 21/3065* (2006.01)
  *H01L 21/768* (2006.01)
  *H01L 23/532* (2006.01)

(52) U.S. Cl.
  CPC .... *H01L 21/3065* (2013.01); *H01L 21/76805* (2013.01); *H01L 21/76816* (2013.01); *H01L 21/76883* (2013.01); *H01L 23/53228* (2013.01); *H01L 23/53257* (2013.01)

(58) Field of Classification Search
  CPC ........... H01L 21/30604; H01L 21/3065; H01L 21/76805; H01L 21/76816; H01L 21/76883
  USPC ........................................................ 257/774
  See application file for complete search history.

(56) References Cited

U.S. PATENT DOCUMENTS

| | | | |
|---|---|---|---|
| 6,194,313 | B1 | 2/2001 | Singh et al. |
| 6,248,660 | B1 * | 6/2001 | Hamanaka .......... H01L 21/7684 |
| | | | 438/692 |
| 10,504,720 | B2 | 12/2019 | Lin et al. |
| 10,818,506 | B2 | 10/2020 | Kobayashi et al. |
| 2013/0224948 | A1 | 8/2013 | Richter et al. |

FOREIGN PATENT DOCUMENTS

| | | |
|---|---|---|
| CN | 104637863 A | 5/2015 |
| CN | 109216186 A | 1/2019 |
| CN | 109166787 B | 6/2019 |
| CN | 108172513 B | 7/2021 |

* cited by examiner

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/105486, filed on Jul. 13, 2022, which claims the priority to Chinese Patent Application No. 202210756155.2, titled "SEMICONDUCTOR STRUCTURE AND MANUFACTURING METHOD THEREOF" and filed on Jun. 30, 2022. The entire contents of International Patent Application No. PCT/CN2022/105486 and Chinese Patent Application No. 202210756155.2 are incorporated herein by reference.

TECHNICAL FIELD

The present disclosure relates to the technical field of semiconductor manufacturing, and in particular to a semiconductor structure and a manufacturing method thereof.

BACKGROUND

In the related art, in the process of manufacturing a semiconductor structure, a conductor material layer needs to be provided in a substrate or other corresponding layer structures to serve as a connection layer between a metal interconnect layer and a lower-layer device, such that the metal interconnect layer is in contact with the lower-layer device. For example, the conductor material layer can be formed by metal tungsten. When tungsten is used as a conductor to connect the metal interconnect layer and the lower-layer device, pre-etched contact holes in the corresponding layer structure are filled with the tungsten, and then excess tungsten is removed. However, in the process of removing the tungsten from the contact holes, an extra part of the tungsten is often removed due to the process requirements, causing an oxide layer on the periphery of the tungsten to be higher than the tungsten, which results in a larger height difference between metal via structures formed by filling the metal interconnect layer with a metal layer. The height difference affects the uniformity of resistance distribution in the metal interconnect layer.

SUMMARY

According to a first aspect of the present disclosure, a manufacturing method of a semiconductor structure is provided, including
 providing a substrate;
 forming a first metal via structure, where the first metal via structure is provided in the substrate, and a top surface of the first metal via structure is flush with a top surface of the substrate, where the top surface of the first metal via structure is made flush with the top surface of the substrate through at least a first process and a second process.

According to a second aspect of the embodiments of the present disclosure, a semiconductor structure is provided, including:
 a substrate;
 a first metal via structure, where the first metal via structure is provided in the substrate, and a top surface of the first metal via structure is flush with a top surface of the substrate, where the top surface of the first metal via structure is made flush with the top surface of the substrate through at least a first process and a second process.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the related technology, in the process of manufacturing a semiconductor structure, a conductor material layer needs to be set in a substrate or other corresponding layer structures to serve as a connection layer between a metal interconnect layer and a lower-layer device, such that the metal interconnect layer is in contact with the lower-layer device. For example, the conductor material layer can be formed by metal tungsten. When tungsten is used as a conductor material, tungsten is first generated in pre-etched contact holes in the substrate or other corresponding layer structures, and then excess tungsten is removed. However, in this method, an extra part of the tungsten is often removed from the contact holes, causing a top surface of the substrate or other corresponding layer structures on the periphery of the generated tungsten to be higher than the tungsten. As a result, when a metal interconnect layer is formed subsequently, a larger height difference exists between metal via structures of the metal interconnect layer formed by filling contact holes in the metal interconnect layer with a metal layer. The height difference affects the uniformity of resistance distribution in the metal interconnect layer.

The present disclosure provides a manufacturing method of a semiconductor structure. In the manufacturing method, after a substrate is provided, corresponding processing is performed on metal via structures in the substrate, such that top surfaces of the metal via structures in the substrate are flush with a top surface of the substrate. Then, during manufacturing of a metal interconnect layer, it can ensure uniformity of resistance distribution in the metal interconnect layer of the semiconductor structure.

The present disclosure is described below with reference to the drawings and specific embodiments. An exemplary embodiment of the present disclosure provides a manufacturing method of a semiconductor structure.

Figure 1:
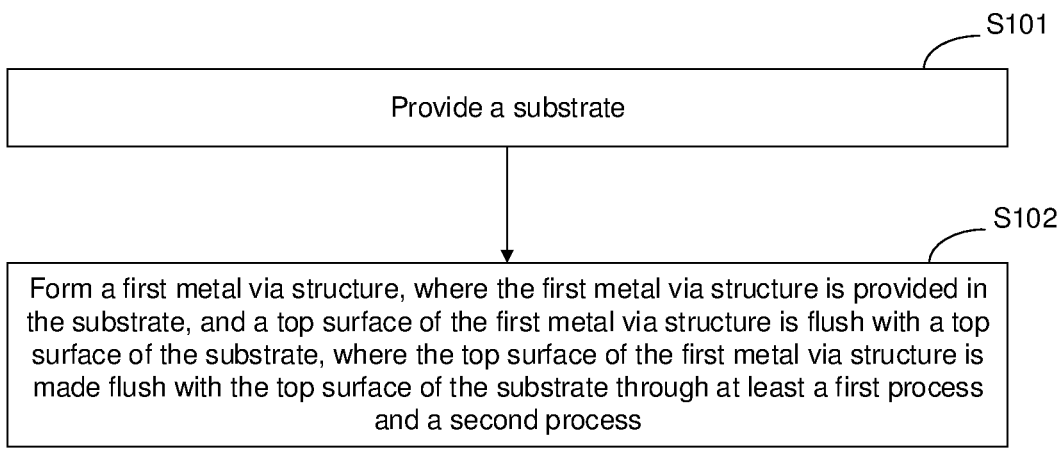
FIG. 1 is a flowchart of a manufacturing method of a semiconductor structure according to an exemplary embodiment.

FIG. 1 is a flowchart of a manufacturing method of a semiconductor structure according to an exemplary embodiment. The manufacturing method includes the following steps:

Step S101: Provide a substrate.

Step S102: Form a first metal via structure, where the first metal via structure is provided in the substrate, and a top surface of the first metal via structure is flush with a top surface of the substrate, where at least a first process and a second process are performed to make the top surface of the first metal via structure flush with the top surface of the substrate.

The first metal via structure may be used as a conductive medium of the metal interconnect layer, to allow the metal interconnect layer to be in contact with devices in a neighboring layer, thereby implementing electrical connections.

Figure 7:
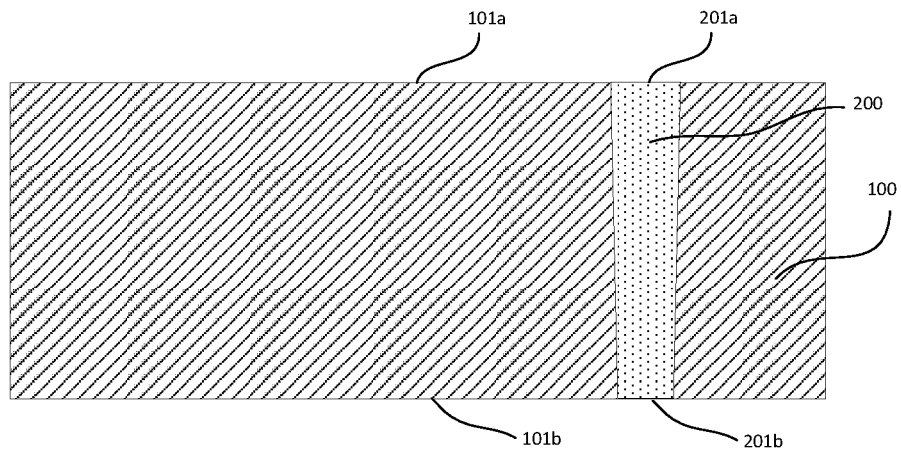
FIG. 7 is a schematic diagram showing that a first metal via structure and a substrate of a semiconductor structure are flush with each other according to an exemplary embodiment.

FIG. 7 illustrates a semiconductor structure manufactured according to the manufacturing method shown in FIG. 1. The semiconductor structure includes:

a substrate 100; and a first metal via structure 200, where the first metal via structure 200 is provided in the substrate 100, a top surface 201a of the first metal via structure 200 is flush with a top surface 101a of the substrate 100, and the top surface 201a of the first metal via structure 200 is made flush with the top surface 101a of the substrate 100 through at least a first process and a second process.

In this exemplary embodiment, in the process of manufacturing of the semiconductor structure, due to a height difference between the top surface 201a of the first metal via structure 200 in the substrate 100 and the top surface 101a of the substrate 100, a large height difference exists between the top surface of the first metal via structure 200 provided in the substrate 100 and the top surface of the substrate 100 in manufacturing of a metal interconnect layer. As a result, when the metal interconnect layer is formed subsequently, a large height difference also exists between metal via structures provided in the metal interconnect layer. The height difference between the metal via structures in the metal interconnect layer affects the uniformity of resistance in the metal interconnect layer.

In the manufacturing method of a semiconductor structure provided by this exemplary embodiment, a substrate 100 is provided, a first metal via structure 200 is provided in the substrate 100, and corresponding processing is performed on the first metal via structure 200 and the substrate 100 through at least a first process and a second process, such that a top surface 201a of the first metal via structure 200 is flush with a top surface 101a of the substrate 100. In this way, when a metal interconnect layer is provided subsequently, a height difference between metal via structures in the metal interconnect layer is reduced, thereby improving the uniformity of resistance in the metal interconnect layer. In addition, when multiple layers of devices are set, the manufacturing method can ensure reliable electrical connections between the subsequently formed metal interconnect layer and devices in a neighboring layer.

As shown in FIG. 7, the substrate 100 may include a semiconductor material. The semiconductor material may be one or more of silicon, germanium, a silicon-germanium compound, and a silicon-carbon compound. For example, the substrate 100 may be a silicon-on-insulator (SOI) substrate or a germanium-on-insulator (GOI) substrate.

Figure 2:
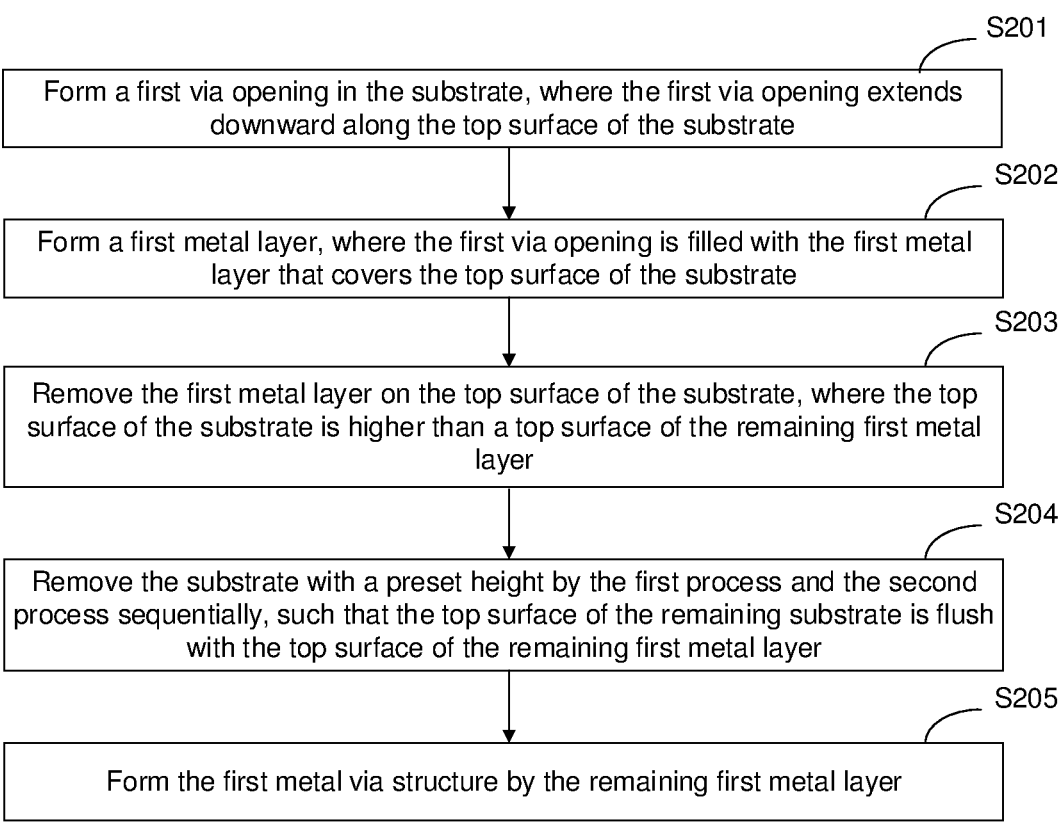
FIG. 2 is a flowchart of a forming method of a first metal via structure of a semiconductor structure according to an exemplary embodiment.

In an exemplary embodiment, FIG. 2 is a flowchart of a forming method of a first metal via structure of a semiconductor structure according to an exemplary embodiment. This embodiment is substantially the same as the foregoing embodiment, except that the forming a first metal via structure includes the following steps:

Step S201: Form a first via opening in the substrate, where the first via opening extends downward along the top surface of the substrate.

Step S202: Form a first metal layer, where the first via opening is filled with the first metal layer that covers the top surface of the substrate.

Step S203: Remove the first metal layer on the top surface of the substrate, where the top surface of the substrate is higher than a top surface of the remaining first metal layer.

Step S204: Remove the substrate with a preset height by the first process and the second process sequentially, such that the top surface of the remaining substrate is flush with the top surface of the remaining first metal layer.

Step S205: Form the first metal via structure by the remaining first metal layer.

As shown in FIG. 7, FIG. 8, FIG. 9 and FIG. 10, in this exemplary embodiment, in the process of removing the first metal layer 200a on the top surface 101a of the substrate 100. Due do defects in process and other aspects, the top surface of the remaining first metal layer 200a in the first via opening 102 is lower than the top surface 101a of the substrate 100. To reduce the height difference between the metal via structures in the subsequently formed metal interconnect layer, in the stage of forming the first metal via structure 200, the top surface 201a of the first metal via structure 200 is made flush with the top surface 101a of the substrate 100. In the embodiment of the present disclosure, a surplus part of the substrate 100 is removed by the first process and the second process sequentially, such that the top surface 101a of the substrate 100 is flush with the top surface of the remaining first metal layer 200a in the first via opening 102.

Figure 8:
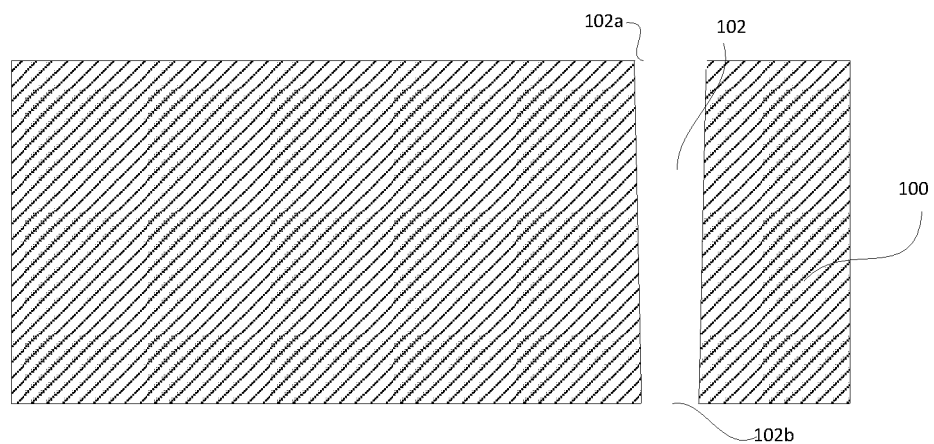
FIG. 8 is a schematic diagram of forming a first via opening in a substrate of a semiconductor structure according to an exemplary embodiment.

In step S201, the manufacturing method includes forming a first via opening 102 in the substrate 100, where the first via opening 102 extends downward along the top surface 101a of the substrate 100. This is shown in FIG. 7 and FIG. 8. The first via opening 102 shown in FIG. 7 and FIG. 8 is a through hole. That is, the first via opening 102 extends from the top surface 101a of the substrate 100 to a bottom surface 101b of the substrate 100. Moreover, projection, on the substrate 100, of an opening 102a of the first via opening 102 on the top surface of the substrate 100 is larger than projection, on the substrate 100, of an opening 102b of the first via opening 102 on the bottom surface 101b of the substrate 100. The first via opening 102 may be in any other shape as required.

Figure 9:
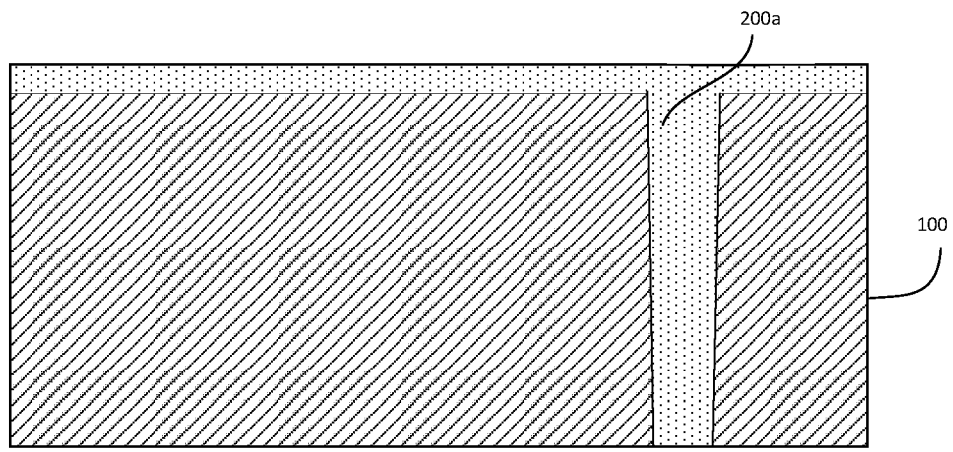
FIG. 9 is a schematic diagram of filling a first via opening in a substrate of a semiconductor structure with a first metal layer according to an exemplary embodiment.

In step S202, the first metal layer 200a is formed in the first via opening 102, as shown in FIG. 9. In the process of forming the first metal layer 200a, the first metal layer 200a may be grown in the first via opening 102 through chemical vapor deposition (CVD). For example, when tungsten is used as a conductor, referring to FIG. 8, tungsten may be grown in the first via opening 102 through CVD, such that the pre-etched first via opening 102 in the substrate 100 is filled with the tungsten.

Figure 10:
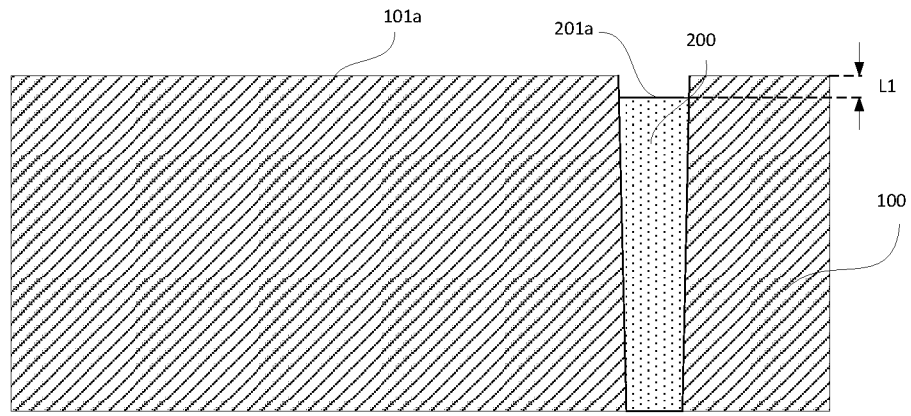
FIG. 10 is a schematic diagram of a semiconductor structure after grinding of a first metal layer according to an exemplary embodiment.

In step S203, as shown in FIG. 9 and FIG. 10, the first metal layer 200a is grown on the top surface 101a of the substrate 100 in the CVD process, a surplus part of the first metal layer 200a on the top surface 101a of the substrate 100 needs to be removed. The first metal layer 200a on the top surface 101a of the substrate 100 may be removed through chemical mechanical polishing (CMP). When the surplus part of the first metal layer 200a on the top surface 101a of the substrate 100 is removed through CMP, an extra part of the first metal layer 200a in the first via opening 102 will also be removed, causing the top surface 101a of the substrate 100 to be higher than the top surface of the first metal layer 200a in the first via opening 102. This is shown in FIG. 10. When the surplus part of the first metal layer 200a is removed through (CMP), a height difference L1 is formed between the top surface 101a of the substrate 100 and the top surface of the first metal layer 200a.

In step S204, to ensure that the top surface of the first metal layer 200a is flush with the top surface 101a of the substrate, the top surface 101a of the substrate 100 is processed, that is, the substrate 100 is removed by the preset height by the first process and the second process sequentially. After the first process and the second process are performed on the top surface of the substrate 100 sequentially, the top surface 101a of the substrate 100 is flush with the top surface 201a of the first metal layer 200a.

In step S205, after the top surface 101a of the substrate 100 is made flush with the top surface of the first metal layer 200a through the first process and the second process sequentially, correspondingly, as shown in FIG. 7, the remaining first metal layer 200a forms the first metal via structure.

In an exemplary embodiment, this embodiment is substantially the same as the foregoing embodiment, except that the first process includes a wet etching process; and the second process includes a dry etching process.

When the top surface 101a of the substrate 100 is treated with the first process so as to be flush with the top surface of the first metal via structure 200, a wet process may be used. For example, a diluted hydrofluoric acid solution (DHF) may be used for etching, which achieves a fast reaction rate and can quickly remove the surplus substrate 100 (such as silicon dioxide). During the second process, a dry process may be used. For example, the surplus substrate 100 is removed through chemical oxide removal (COR). This method makes the etching amount more stable and achieves good wafer surface roughness. In this embodiment, the first process and the second process are used in sequence, which can ensure good wafer surface roughness while ensuring high etching efficiency, thereby achieving a good etching effect.

Figure 3:
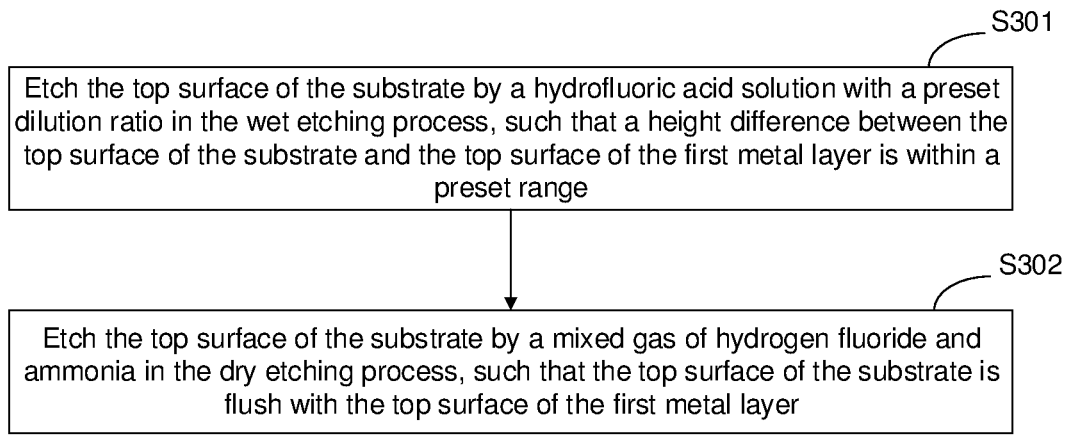
FIG. 3 is a flowchart of processing combining a first process and a second process during manufacturing of a semiconductor structure according to an exemplary embodiment.

In an exemplary embodiment, FIG. 3 is a flowchart of removing the substrate with a preset height by the first process and the second process sequentially such that the top surface of the remaining substrate is flush with the top surface of the remaining first metal layer during manufacturing of a semiconductor structure according to an exemplary embodiment. This embodiment is substantially the same as the foregoing embodiment, except that the removing the substrate with a preset height by the first process and the second process sequentially, such that the top surface of the remaining substrate is flush with the top surface of the remaining first metal layer includes the following steps:

Step S301: Etch the top surface of the substrate by a hydrofluoric acid solution with a preset dilution ratio in the wet etching process, such that a height difference between the top surface of the substrate and the top surface of the first metal layer is within a preset range.

Figure 11:
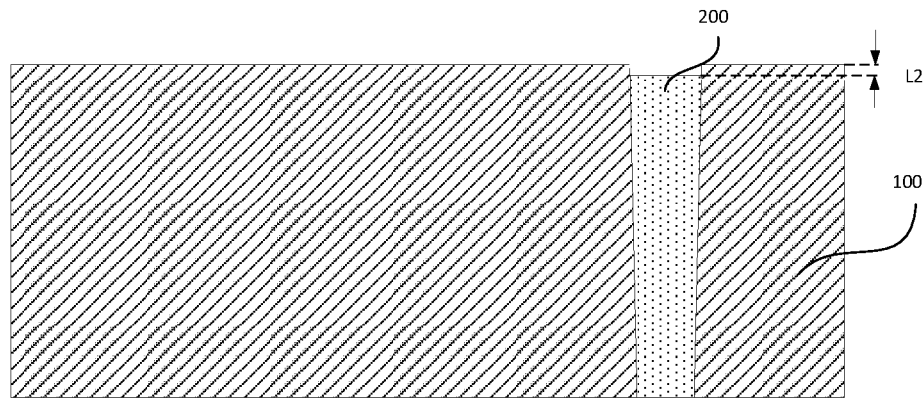
FIG. 11 is a schematic diagram of a semiconductor structure after a first process according to an exemplary embodiment.

As shown in FIG. 10 to FIG. 11, in this step, the height difference between the top surface 101a of the substrate 100 and the top surface of the first metal layer 200a is reduced from original L1 to L2.

Step S302: Etch the top surface of the substrate by a mixed gas of hydrogen fluoride and ammonia in the dry etching process, such that the top surface of the substrate is flush with the top surface of the first metal layer.

As shown in FIG. 7 and FIG. 11, in this step, the height difference between the top surface 101a of the substrate 100 and the top surface of the first metal layer 200a is reduced from original L2 to 0, that is, the top surface of the first metal layer 200a is flush with the top surface 101a of the substrate 100.

In step S301, as shown in FIG. 10 and FIG. 11, in this exemplary embodiment, when the substrate 100 is processed by the first process and the second process sequentially such that the top surface 101a of the substrate 100 is flush with the top surface of the first metal layer 200a, an etching speed and an etching depth of the first process need to be controlled. Therefore, when the substrate 100 is processed with the first process, a hydrofluoric acid solution at a preset dilution ratio is used to etch the top surface 101a of the substrate 100, such that the height difference between the top surface 101a of the substrate 100 and the top surface of the first metal layer 200a falls within a preset range rapidly. Etching with the hydrofluoric acid solution at the preset dilution ratio is called wet etching. The wet etching using the hydrogen fluoride solution at the preset dilution ratio has a much lower etching speed, and can be used for removing most of the top surface 101a of the substrate 100 in the thickness direction, such that the height difference between the top surface 101a of the substrate 100 and the top surface of the first metal layer 200a falls within the preset range. To ensure that the height difference between the top surface 101a of the substrate 100 and the top surface of the first metal layer 200a falls within the preset range, the substrate 100 may be processed with the first process repeatedly, or the height difference can be controlled by controlling the concentration of the hydrofluoric acid solution and the processing time. By processing the substrate 100 with the first process, the etching speed can be ensured. The height difference between the top surface 101a of the substrate 100 and the top surface of the first metal layer 200a falls within the preset range, which can prepare for processing the substrate 100 with the second process to ensure good wafer surface roughness.

In an exemplary embodiment, the top surface 101a of the substrate 100 is etched by the hydrofluoric acid solution at the preset dilution ratio, the height difference between the top surface 101a of the substrate 100 and the top surface of the first metal layer 200a falls within the preset range of 2 to 3 nm. The height difference within the preset range can avoid the problem of low overall process efficiency caused by a high thickness of a surplus part of the substrate 100 reserved for the second process.

In step S302, as shown in FIG. 7 and FIG. 11, the top surface 101a of the substrate 100 is etched by the hydrofluoric acid solution at the preset dilution ratio, such that after the height difference between the top surface 101a of the substrate 100 and the top surface of the first metal layer 200a falls within the preset range, the top surface 101a of the substrate 100 can be etched by a mixed gas of hydrogen fluoride and ammonia. Etching with the mixed gas of hydrogen fluoride and ammonia is dry etching, which has a relatively slow etching speed and can control the etching height more precisely compared with wet etching, such that the top surface 101a of the substrate 100 is flush with the top surface of the first metal layer 200a. In this step, the height difference between the top surface 101a of the substrate 100 and the top surface of the first metal layer 200a is reduced from original L2 to 0, to form a structure in which the top surface 101a of the substrate 100 is flush with the top surface of the first metal layer 200a, as shown in FIG. 7.

In an exemplary embodiment, this embodiment is substantially the same as the foregoing embodiment, except that a preparation method of the hydrofluoric acid solution with the preset dilution ratio includes: mixing a hydrofluoric acid solution with a concentration of 49% and water at a volume ratio of 1:100 to 1:500.

In an exemplary embodiment, in the dry etching process, a flow rate of the hydrogen fluoride is 200 sccm to 300 sccm, and a flow rate of the ammonia is 100 sccm to 160 sccm.

The hydrofluoric acid solution at the preset dilution ratio may be prepared by mixing hydrogen fluoride with a concentration of 49% and water at a volume ratio, where the preset dilution ratio may be, for example, 1:200. When the top surface 101a of the substrate 100 is etched by the hydrofluoric acid solution, the wet etching rate may be a preset etching rate. For example, etching may be performed at an etching rate of 0.9 nm/10 s.

In an exemplary embodiment, this embodiment is substantially the same as the foregoing embodiment, except that the manufacturing method of a semiconductor structure further includes the following step:

form a second metal via structure, where the second metal via structure is provided in the substrate, and a height difference between a top surface of the second metal via structure and the top surface of first metal via structure is less than or equal to a preset height difference. The preset height difference may be set according to actual needs. The preset height difference may be any value greater than or equal to 0.

Figure 13:
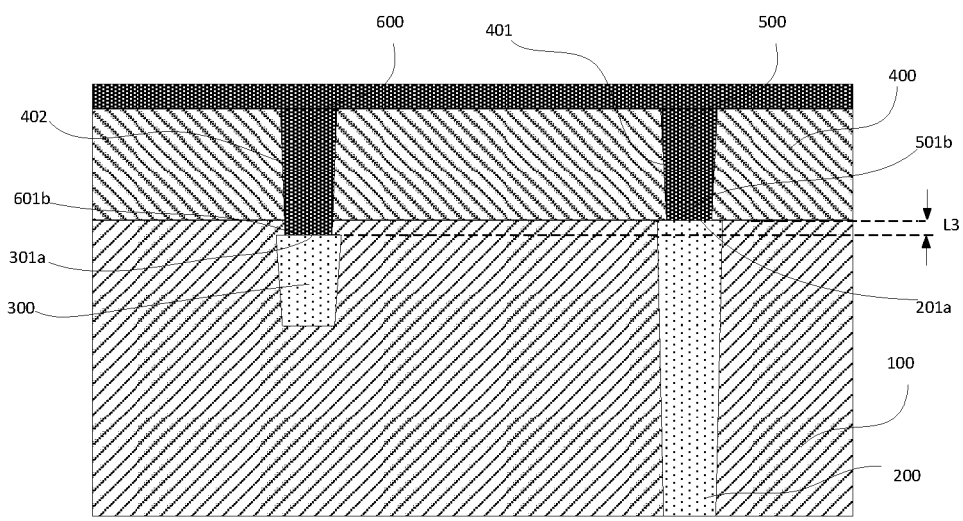
FIG. 13 is a diagram of a semiconductor structure according to an exemplary embodiment.

FIG. 13 illustrates a semiconductor structure according to an exemplary embodiment of the present disclosure. The semiconductor structure shown in FIG. 13 further includes:

a second metal via structure 300, where the second metal via structure 300 is provided in the substrate 100, and a height difference between a top surface 301a of the second metal via structure 300 and the top surface 201*a* of first metal via structure 200 is less than or equal to a preset height difference.

In the exemplary embodiment shown in FIG. 13, the height difference between the top surface 301*a* of the second metal via structure 300 and the top surface 201*a* of the first metal via structure 200 is greater than 0, that is, the top surface 301*a* of the second metal via structure 300 is lower than the top surface 201*a* of the first metal via structure 200. In other exemplary embodiments of the present disclosure, the height difference between the top surface 301*a* of the second metal via structure 300 and the top surface 201*a* of the first metal via structure 200 may alternatively be 0, that is, the top surface 301*a* of the second metal via structure 300 is flush with the top surface 201*a* of the first metal via structure 200. This may be determined according to actual needs, which is not limited in the present disclosure.

Considering that the manufactured semiconductor structure may be used as a memory component such as a dynamic random access memory (DRAM) and devices such as a capacitor may be provided in the corresponding substrate 100, a plurality of metal via structures need to be arranged on the substrate 100 provided for the metal interconnect layer.

Figure 14:
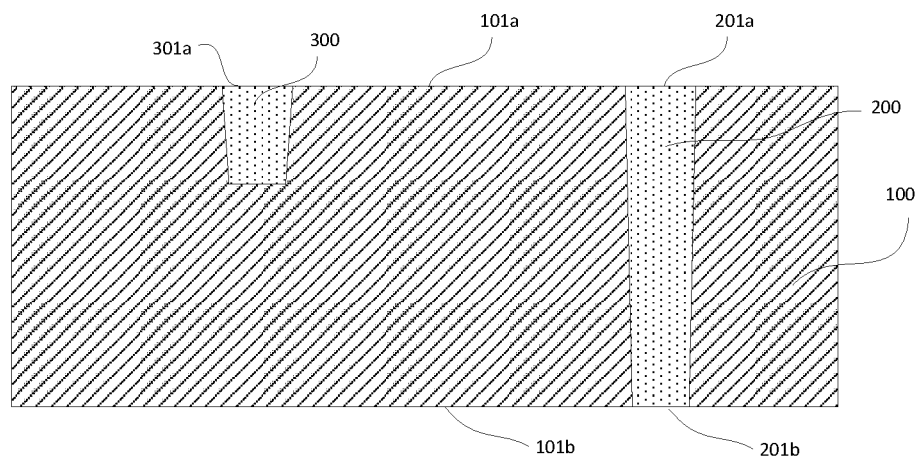
FIG. 14 is a schematic diagram of a semiconductor structure having a first metal via structure and a second metal via structure according to an exemplary embodiment.

In an exemplary embodiment of the present disclosure, after the first metal via structure 200 is provided at the corresponding location in the substrate 100, a second metal via structure 300 may further be provided. When the second metal via structure 300 is provided, if the top surface 301*a* of the second metal via structure 300 needs to be flush with the top surface 101*a* of the substrate 100, that is, if the preset height difference needs to be 0, the height difference between the top surface 301*a* of the second metal via structure 300 and the top surface 201*a* of the first metal via structure 200 is equal to a preset height difference. As shown in FIG. 14, a third process and a fourth process may be performed sequentially, such that the top surface 301*a* of the second metal via structure 300 is flush with the top surface 101*a* of the substrate 100.

Figure 16:
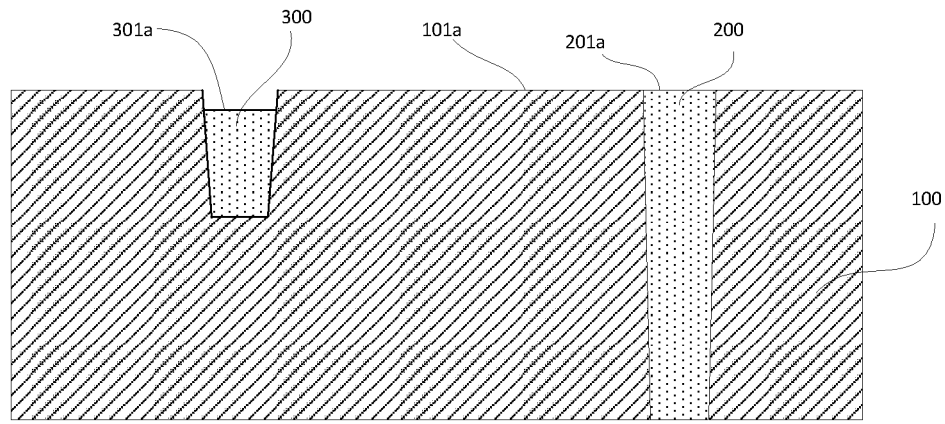
FIG. 16 is a diagram of a semiconductor structure in which a top surface of a second metal via structure and a top surface of a substrate have a reserved height difference according to an exemplary embodiment.

In an exemplary embodiment of the present disclosure, when the second metal via structure 300 is provided, if the height difference between the top surface 201*a* of the first metal via structure 200 and the top surface of the second metal via structure 300 is greater than 0, as shown in FIG. 16, the third process and the fourth process may be performed sequentially to form the second metal via structure 300, where a height of the top surface 301*a* of the second metal via structure 300 is different from that of the top surface 201*a* of the first metal via structure 200.

Figure 4:
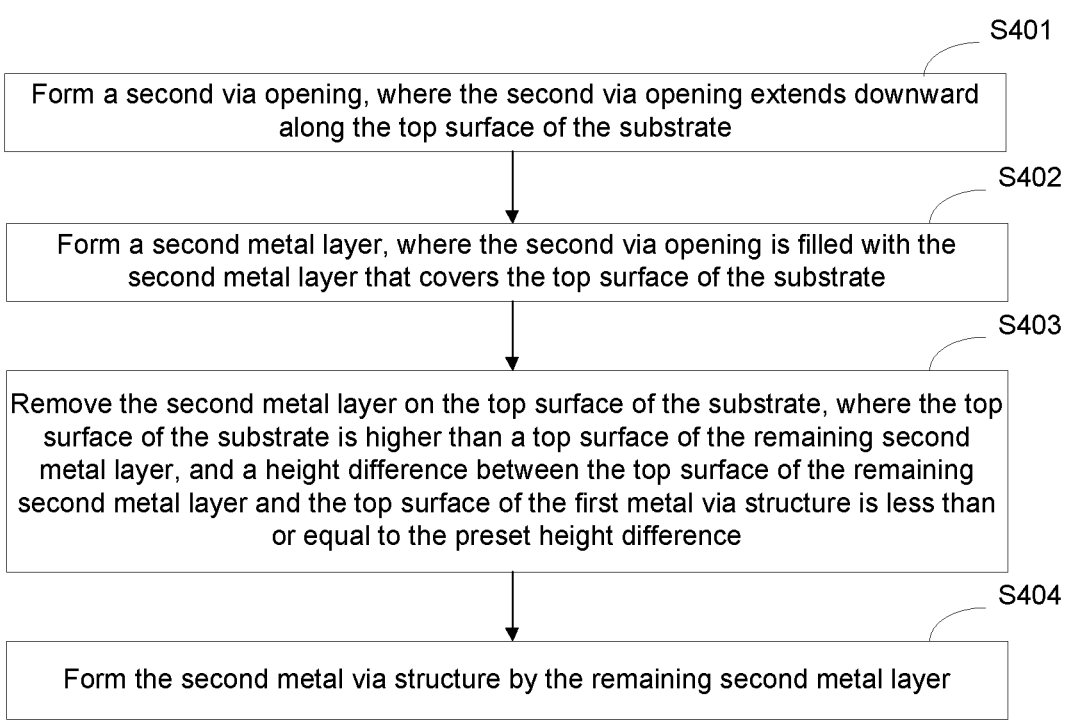
FIG. 4 is a flowchart of a forming method of a second metal via structure of a semiconductor structure according to an exemplary embodiment.
Figure 12:
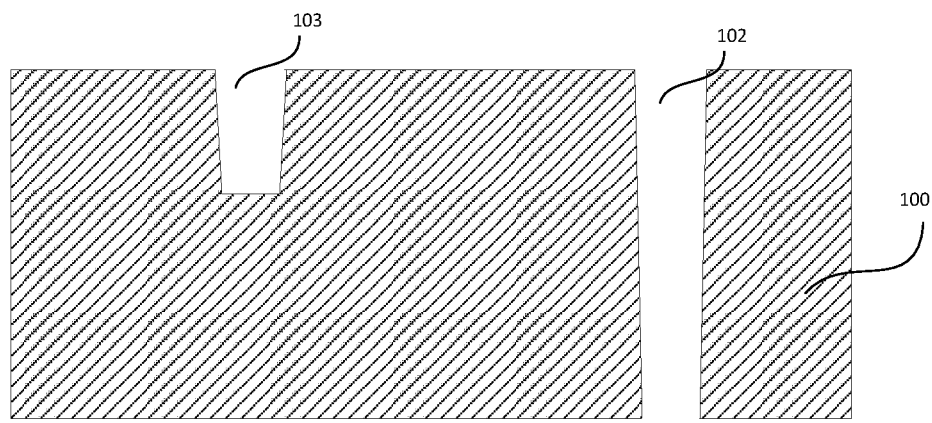
FIG. 12 is a schematic diagram of a semiconductor structure provided with a second via opening according to an exemplary embodiment.

In an exemplary embodiment, FIG. 4 is a flowchart of a forming method of a second metal via structure of a semiconductor structure according to an exemplary embodiment. This embodiment is substantially the same as the foregoing embodiment, except that the forming a second metal via structure includes the following steps:

Step S401: Form a second via opening, where the second via opening extends downward along the top surface of the substrate, as shown in FIG. 12.

Step S402: Form a second metal layer, where the second via opening is filled with the second metal layer that covers the top surface of the substrate, as shown in FIG. 16.

Step S403: Remove the second metal layer on the top surface of the substrate, where the top surface of the substrate is higher than a top surface of the remaining second metal layer, and a height difference between the top surface of the remaining second metal layer and the top surface of the first metal via structure is less than or equal to the preset height difference, as shown in FIG. 16.

Step S404: Form the second metal via structure by the remaining second metal layer, as shown in FIG. 16.

In step S401, referring to FIG. 12, the second via opening 103 may be formed in the substrate 100. The second via opening 103 extends downward along the top surface 101*a* of the substrate 100. As shown in FIG. 12, the second via opening 103 shown in FIG. 12 extends downward by a given height from the top surface 101*a* of the substrate 100. Projection, on the substrate 100, of an opening of the second via opening 103 on the top surface 101*a* of the substrate 100 is greater than projection, on the substrate 100, of an opening of the second via opening 103 on the bottom surface 101*b* of the substrate 100. The second via opening 103 may be in any other shape as required.

In step S402, the second metal layer 300*a* is formed in the second via opening 103. As shown in FIG. 12 and FIG. 13, in the process of forming the second metal layer 300*a*, the second metal layer 300*a* may be grown in the second via opening 103 through CVD. For example, when tungsten is used as a conductor, tungsten may be grown in the second via opening 103 through CVD, such that the pre-etched second via opening 103 in the substrate 100 is filled with the tungsten.

In step S403, the second metal layer 300*a* is grown on the top surface of the substrate 100 in the CVD process, a surplus part of the second metal layer 300*a* on the top surface 101*a* of the substrate 100 needs to be removed. The second metal layer 300*a* on the top surface 101*a* of the substrate 100 may be removed through CMP. During removal of the second metal layer 300*a* on the top surface 101*a* of the substrate 100, the second metal layer 300*a* in the second via opening 103 may also be removed.

To make the top surface 101*a* of the substrate 100 to be higher than the top surface of the second metal layer 300*a* and the height difference between the top surface of the remaining second metal layer 300*a* and the top surface 201*a* of the first metal via structure 200 less than or equal to the preset height difference, the top surface 101*a* of the substrate 100 may further be removed with a preset height through the third process and the fourth process sequentially, as shown in FIG. 16, such that the top surface 101*a* of the substrate 100 is higher than the top surface of the remaining second metal layer 300*a*, and the height difference between the top surface of the second metal layer 300*a* and the top surface 201*a* of the first metal via structure 200 is L3 (as shown in FIG. 13), which is less than or equal to the preset height difference.

Similar to the first process, the third process is a wet etching process; similar to the second process, the fourth process is a dry etching process. For specific process procedures and process parameters, reference may be made to the first process and the second process, and details are not described herein.

In step S403, the remaining second metal layer 300*a* forms the second metal via structure 300. As shown in FIG. 13, the top surface 301*a* of the second metal via structure 300 is lower than the top surface 101*a* of the substrate 100, and has a height difference of L3 with the top surface 201*a* of the first metal via structure 200, where L3 is less than or equal to the preset height difference.

In the embodiment of the present disclosure, the height difference between the top surface 201*a* of the first metal via structure 200 and the top surface 301*a* of the second metal via structure 300 is L3, as shown in FIG. 13. To form such a height difference, during removal of the second metal layer 300a, an extra part of the second metal layer 300a in the second via opening 103 can be removed, such that the top surface of the remaining second metal layer 300a in the second via opening 103 is lower than the top surface 201a of the first metal via structure 200 in the first via opening 102. In this way, the top surface 301a of the formed second metal via structure 300 is lower than the top surface 201a of the first metal via structure 200. After part of the substrate 100 near the top surface 201a of the first metal via structure 200 is processed by the first process and the second process, the top surface 201a of the first metal via structure 200 is flush with the top surface 101a of the substrate 100, and the height difference between the top surface 301a of the second metal via structure 300 and the top surface 101a of the substrate 100 is also reduced, which becomes the height difference between the top surface 301a of the second metal via structure 300 and the top surface 201a of the first metal via structure 200.

In the embodiment of the present disclosure, to improve the efficiency of the manufacturing process, the first metal via structure 200 and the second metal via structure 300 may be formed simultaneously. In this case, the first metal layer 200a and the second metal layer 300a are a same metal layer. The first process and the third process are a same process; and the fourth process and the second process are a same process. That is, the first via opening 102 and the second via opening 103 are formed in the substrate 100; a metal layer is formed on the top surface 101a of the substrate 100, where the first via opening 102 and the second via opening 103 as well as the top surface 101a of the substrate 100 is filled with the metal layer. The metal layer on the top surface 101a of the substrate 100 and part of the metal layer in the first via opening 102 and the second via opening 103 are removed. In this process, an extra part of the metal layer in the second via opening 103 may be removed, such that a height difference between the top surface of the metal layer in the second via opening 103 after removal and the top surface of the metal layer in the first via opening 102 is less than or equal to the preset height difference. The substrate 100 is removed with a preset height through the first process and the second process sequentially, such that the top surface of the remaining metal layer in the first via opening 102 is flush with the top surface of the substrate 100.

FIG. 12 illustrates a semiconductor structure according to an exemplary embodiment. In the semiconductor structure shown in FIG. 12, the substrate 100 includes the first via opening 102 and the second via opening 103, where the first via opening 102 and the second via opening 103 have different depths. The first via opening 102 is filled with a conductor to form the first metal layer 200a, and the first metal via structure 200 is manufactured according to the first metal layer 200a. As shown in FIG. 13, the second via opening 103 is filled with a conductor to form the second metal layer 300a, and the second metal via structure 300 is manufactured according to the second metal layer 300a. The top surface 301a of the second metal via structure 300 is lower than the top surface 201a of the first metal via structure 200. The top surface 201a of the first metal via structure 200 is flush with the top surface 101a of the substrate 100, and the height difference between the top surface 301a of the second metal via structure 300 and the top surface 101a of the substrate 100 is L3. In the manufacturing method of a semiconductor structure provided by the exemplary embodiment of the present disclosure, after the top surface 201a of the first metal via structure 200 is made flush with the top surface 101a of the substrate by the first process and the second process sequentially, the height difference between the top surface 301a of the second metal via structure 300 and the top surface 101a of the substrate is also reduced, such that the height difference is L3.

Further referring to FIG. 13, an oxide layer 400 is provided on the substrate 100, a third via opening 401 and a fourth via opening 402 are provided on the oxide layer 400, where the third via opening 401 corresponds to the first via opening 102, and the fourth via opening 402 corresponds to the second via opening 103; a third metal via structure 500 is provided in the third via opening 401, and a fourth metal via structure 600 is provided in the fourth via opening 402. The third metal via structure 500 and the fourth metal via structure 600 are metal via structures of the metal interconnect layer. A bottom surface 501b of the third metal via structure 500 is in contact with the top surface 201a of the first metal via structure 200; and a bottom surface 601b of the fourth metal via structure 600 is in contact with the top surface 301a of the second metal via structure 300. Because the height difference of the top surface 301a of the second metal via structure 300 is reduced to L3, the height difference between the bottom surface 601b of the fourth metal via structure 600 and the top surface 101a of the substrate 100 is also reduced to L3, such that the metal via structures in the metal interconnect layer protrude from the oxide layer 400 by a smaller height, thereby improving the resistance uniformity of the metal interconnect layer.

Figure 5:
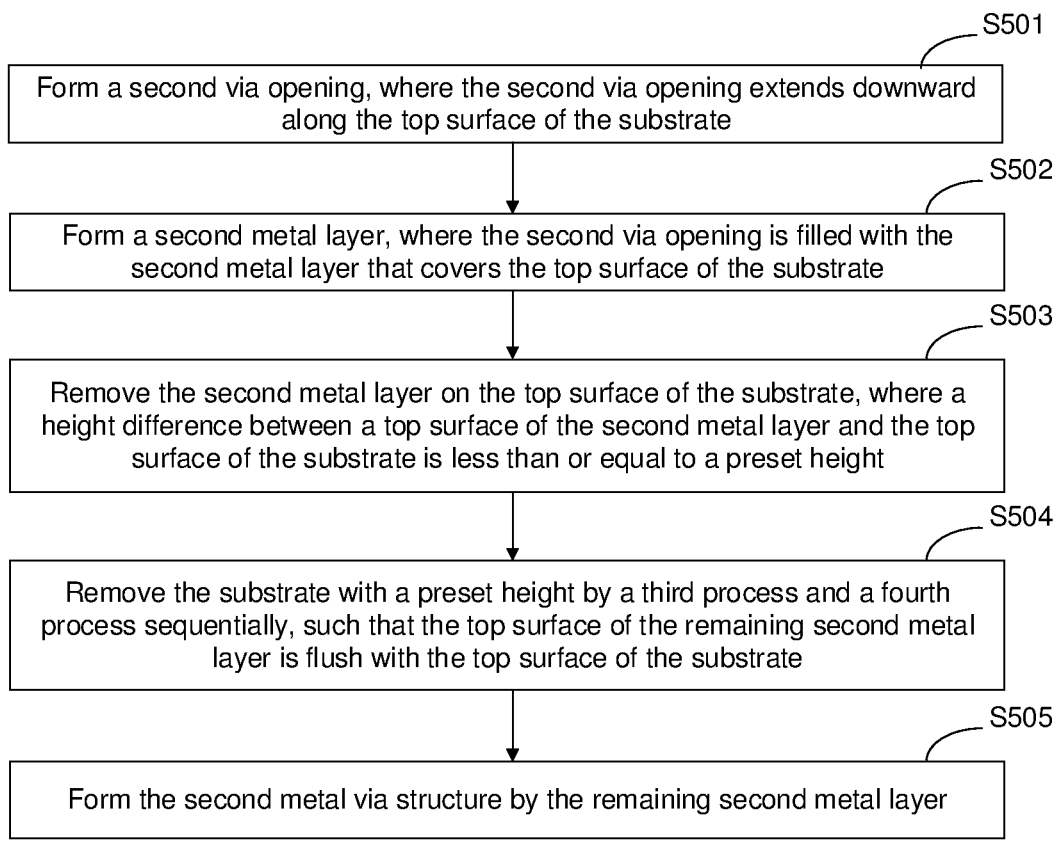
FIG. 5 is a flowchart of a forming method of a second metal via structure of a semiconductor structure according to an exemplary embodiment.

In an exemplary embodiment, FIG. 5 is a flowchart of a forming method of a second metal via structure of a semiconductor structure according to an exemplary embodiment. This embodiment is substantially the same as the foregoing embodiment, except that the forming a second metal via structure includes the following steps:

Step S501: Form a second via opening, where the second via opening extends downward along the top surface of the substrate, as shown in FIG. 12.

Figure 15:
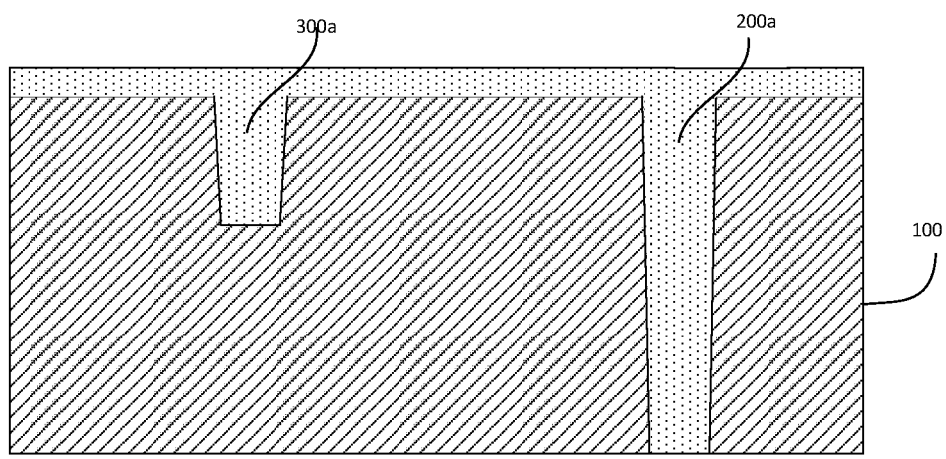
FIG. 15 is a schematic diagram of a substrate of a semiconductor structure after a second via opening is filled with a second metal layer according to an exemplary embodiment.

Step S502: Form a second metal layer, where the second via opening is filled with the second metal layer that covers the top surface of the substrate, as shown in FIG. 15.

Figure 17:
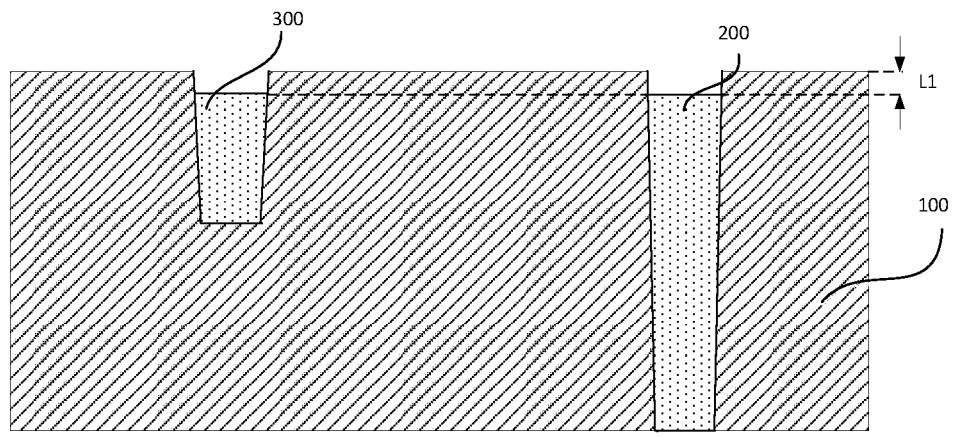
FIG. 17 is a schematic diagram of a semiconductor structure after grinding of a first metal layer and a second metal layer according to an exemplary embodiment.

Step S503: Remove the second metal layer on the top surface of the substrate, where a height difference between a top surface of the second metal layer and the top surface of the substrate is less than or equal to a preset height, as shown in FIG. 17.

Figure 18:
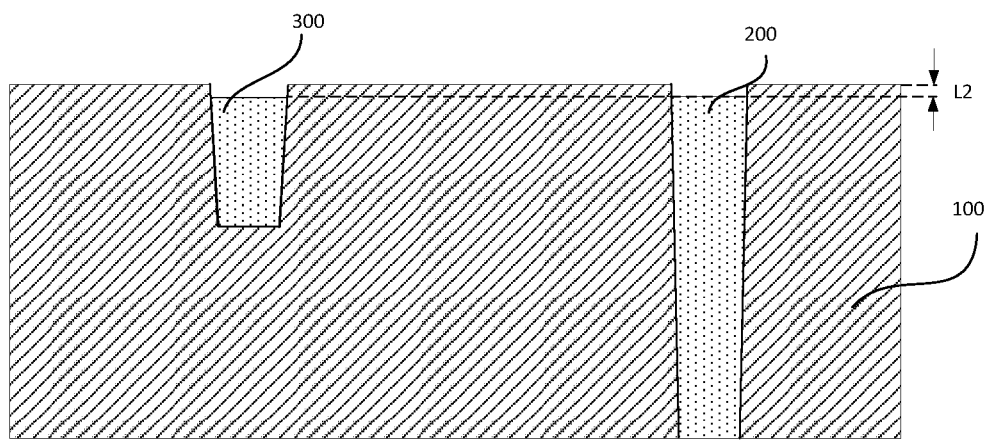
FIG. 18 is a schematic diagram of a semiconductor structure after a first process according to an exemplary embodiment.
Figure 21:
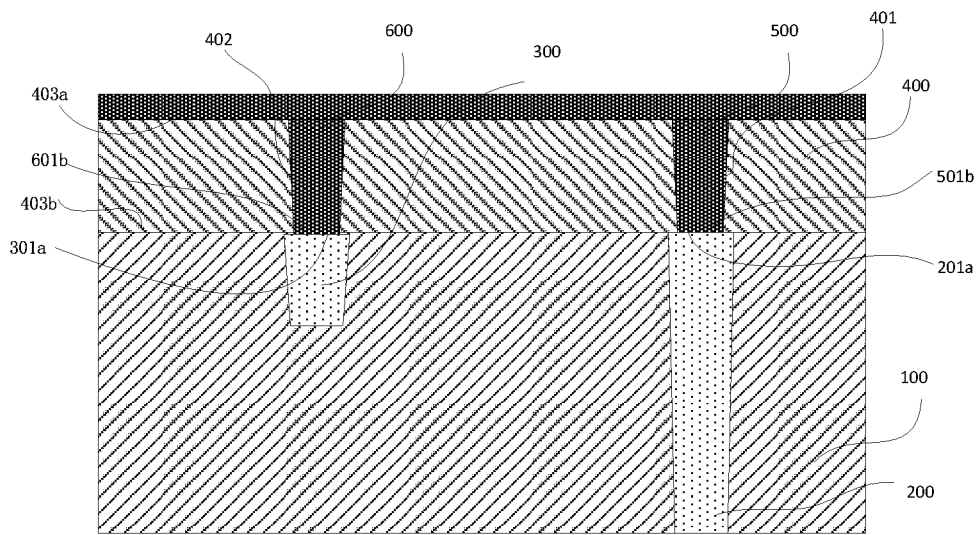
FIG. 21 is a schematic diagram of a semiconductor structure filled with a third metal layer according to an exemplary embodiment.

Step S504: Remove the substrate with a preset height by a third process and a fourth process sequentially, such that the top surface of the remaining second metal layer is flush with the top surface of the substrate, as shown in FIG. 17 to FIG. 18 and FIG. 21.

Step S505: Form the second metal via structure by the remaining second metal layer, as shown in FIG. 21.

In this exemplary embodiment, the manufacturing principle of forming the second metal via structure 300 is the same as that in the above description, and details are not described herein again. This embodiment differs from the foregoing embodiment in that the top surface 301a of the second metal via structure 300 is flush with the top surface 201a of the first metal via structure 200, as shown in FIG. 21.

In this embodiment, the first metal via structure 200 and the second metal via structure 300 may also be formed on the substrate 100 simultaneously:

As shown in FIG. 12, the substrate 100 is provided, and the first via opening 102 and the second via opening 103 are formed in the substrate 100, where the first via opening 102 and the second via opening 103 extend downward along the top surface of the substrate 100.

As shown in FIG. 15, then, a metal layer is formed, where the first via opening 102 and the second via opening 103 are filled with the metal layer, and the metal layer covers the top surface 101a of the substrate 100. The metal layer in the first via opening 102 serves as the first metal layer 200a, and the metal layer in the second via opening 103 serves as the second metal layer 300a.

As shown in FIG. 17, next, the metal layer on the top surface of the substrate 100 is removed; the height difference between the top surface of the first metal layer 200a in the first via opening 102 and the top surface of the substrate 100, and the height difference between the top surface of the second metal layer 300a in the second via opening 103 and the top surface of the substrate 100 are both L1, and both less than the preset height difference.

As shown in FIG. 17 and FIG. 18, by the first process, i.e., wet etching process, the height difference between the top surface of the remaining first metal layer 200a and the top surface 101a of the substrate 100, and the height difference between the top surface of the second metal layer 300a and the top surface 101a of the substrate 100 become L2, where the height differences fall within a preset range of 2 to 3 nm. Then, through the second process, i.e., dry etching process, the substrate 100 is removed continuously, such that the top surface of the remaining first metal layer 200a and the top surface of the second metal layer 300a are flush with the top surface 101a of the substrate 100, as shown in FIG. 21. In this way, the remaining first metal layer 200a and the second metal layer 300a are obtained, to form the first metal via structure 200 and the second metal via structure 300.

Figure 6:
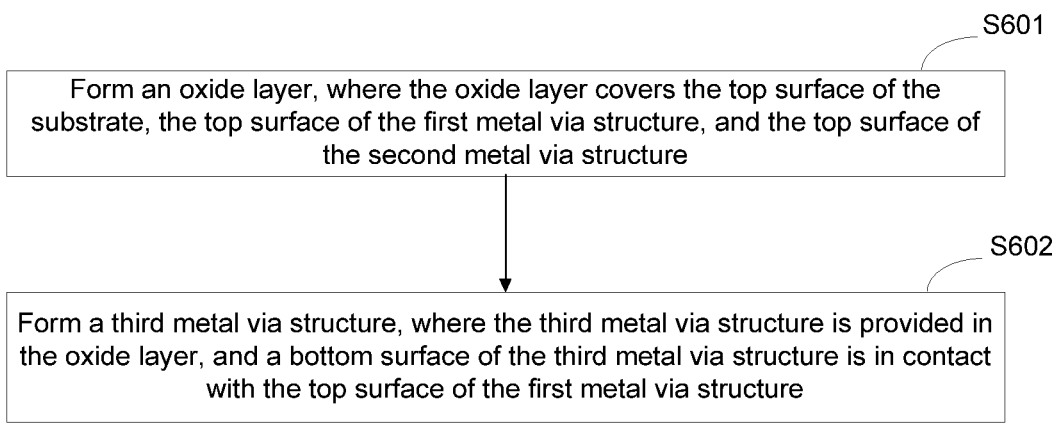
FIG. 6 is a flowchart of a forming method of a third metal via structure in an oxide layer of a semiconductor structure according to an exemplary embodiment.

In an exemplary embodiment, FIG. 6 is a flowchart of a forming method of a third metal via structure in an oxide layer of a semiconductor structure according to an exemplary embodiment. This embodiment is substantially the same as the foregoing embodiment, except that in the semiconductor structure formed by this manufacturing method, the top surface 201a of the first metal via structure 200 is flush with the top surface 301a of the second metal via structure 300. The manufacturing method further includes:

Step S601: Form an oxide layer, where the oxide layer covers the top surface of the substrate, the top surface of the first metal via structure, and the top surface of the second metal via structure.

Step S602: Form a third metal via structure, where the third metal via structure is provided in the oxide layer, and a bottom surface of the third metal via structure is in contact with the top surface of the first metal via structure.

Figure 19:
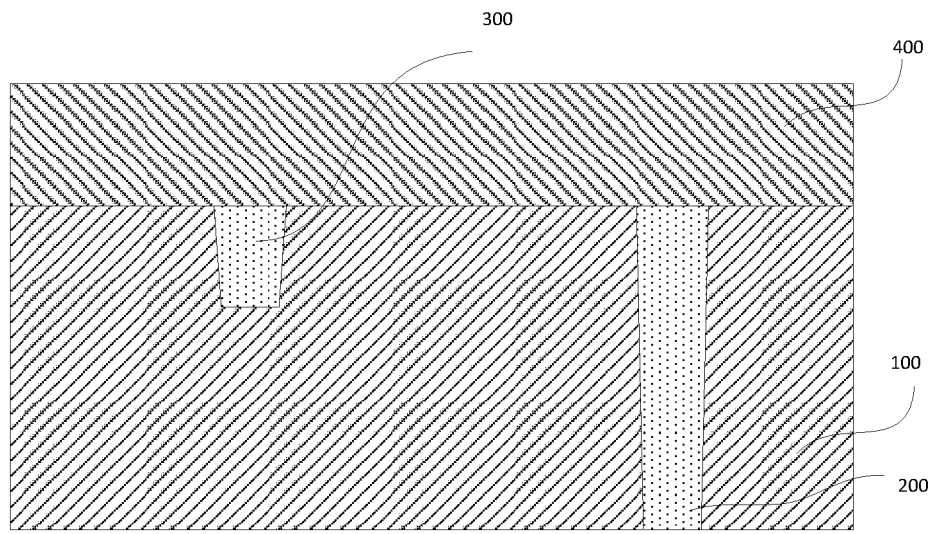
FIG. 19 is a schematic diagram of a semiconductor structure provided with an oxide layer in a substrate according to an exemplary embodiment.

As shown in FIG. 19, in step S601, after the first metal via structure 200 and the second metal via structure 300 are provided in the substrate 100, the oxide layer 400 is formed on the top surface 101a of the substrate 100, where the oxide layer 400 covers the top surface 101a of the substrate 100, the top surface 201a of the first metal via structure 200, and the top surface 301a of the second metal via structure 300.

In this exemplary embodiment, FIG. 21 illustrates a semiconductor structure according to an exemplary embodiment. The semiconductor structure further includes:

an oxide layer 400, where the oxide layer 400 covers the top surface of the substrate 100, the top surface of the first metal via structure 200, and the top surface of the second metal via structure 300; and a third metal via structure 500, where the third metal via structure 500 is provided in the oxide layer 400, and a bottom surface 501b of the third metal via structure 500 is in contact with the top surface 201a of the first metal via structure 200.

In this exemplary embodiment, the oxide layer 400 may also be formed by depositing a dielectric material on the top surface 101a of the substrate 100 through chemical vapor deposition (CVD) or physical vapor deposition (PVD). The dielectric material in the oxide layer 400 may be silicon dioxide, silicon nitride, or a combination thereof. Therefore, in the semiconductor structure manufactured by the manufacturing method of a semiconductor structure, the oxide layer 400 may also be formed on the substrate 100, and structures such as the third metal via structure 500 may further be provided.

In an exemplary embodiment, projection of the top surface 201a of the first metal via structure 200 on the substrate 100 is larger than projection of the bottom surface 501b of the third metal via structure 500 on the substrate 100.

Figure 20:
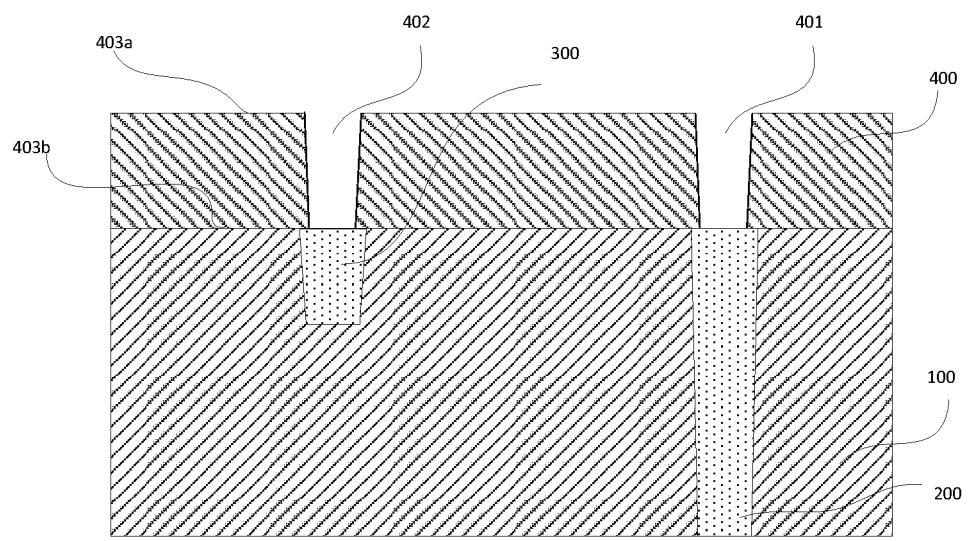
FIG. 20 is a schematic diagram of a semiconductor structure provided with a third via opening and a fourth via opening in an oxide layer according to an exemplary embodiment.

As shown in FIG. 20, when the third metal via structure 500 is provided, a third via opening 401 may be formed in the same manner as forming the first via opening 102 or the second via opening 103, where the third via opening 401 extends along a direction from the top surface 403a of the oxide layer 400 to the bottom surface 403b of the oxide layer 400. Along the direction from the top surface 101a of the substrate 100 to the bottom surface 101b of the substrate 100, a radial cross-section size of the first metal via structure 200 provided in the first via opening 102 decreases gradually. Therefore, when the third metal via structure 500 is provided in the third via opening 401, it is unnecessary to make the bottom surface 501b of the third metal via structure 500 excessively large, so as to reduce the consumption of the material of the third metal via structure 500. In this case, when the third metal via structure 500 is connected to the first metal via structure 200, projection of the bottom surface 501b of the third metal via structure 500 on the substrate 100 only needs to be smaller than projection of the top surface 201a of the first metal via structure 200 on the substrate 100.

In an exemplary embodiment, the manufacturing method further includes:

forming a fourth metal via structure 600, where the fourth metal via structure 600 is provided in the oxide layer 400, and a bottom surface 601b of the fourth metal via structure 600 is in contact with the top surface 301a of the second metal via structure 300, as shown in FIG. 21.

FIG. 21 illustrates a semiconductor structure according to an exemplary embodiment. The semiconductor structure further includes:

a fourth metal via structure 600, where the fourth metal via structure 600 is provided in the oxide layer 400, and a bottom surface 601b of the fourth metal via structure 600 is in contact with the top surface 301a of the second metal via structure 300.

In an exemplary embodiment, projection of the top surface 301a of the second metal via structure 300 on the substrate 100 is larger than projection of the bottom surface 601b of the fourth metal via structure 600 on the substrate 100.

In an exemplary embodiment, FIG. 21 illustrates a semiconductor structure according to an exemplary embodiment. Materials of the first metal via structure 200 and the second metal via structure 300 include tungsten; materials of the third metal via structure 500 and the fourth metal via structure 600 include copper. The third metal via structure 500 and the fourth metal via structure 600 are metal via structures of the metal interconnect layer. The first metal via structure 200 and the second metal via structure 300 are connection layers between the metal interconnect layer and lower-layer devices; the first metal via structure 200 and the second metal via structure 300 are used for forming contact between the metal interconnect layer and the lower-layer devices.

As shown in FIG. 20, when the fourth metal via structure 600 is provided, a fourth via opening 402 may be formed in the same manner as forming the first via opening 102 or the second via opening 103, where the fourth via opening 402 extends along a direction from the top surface 403a of the oxide layer 400 to the bottom surface 403b of the oxide layer 400. As shown in FIG. 21, along the direction from the top surface 101a of the substrate 100 to the bottom surface 101b of the substrate 100, a radial cross-section size of the second metal via structure 300 provided in the second via opening 103 decreases gradually. Therefore, when the fourth metal via structure 600 is provided in the fourth via opening 402, it is unnecessary to make the bottom surface 601b of the fourth metal via structure 600 excessively large, so as to reduce the consumption of the material of the fourth metal via structure 600. In this case, when the fourth metal via structure 600 is connected to the second metal via structure 300, projection of the bottom surface 601b of the fourth metal via structure 600 on the substrate 100 only needs to be smaller than projection of the top surface 301a of the second metal via structure 300 on the substrate 100.

In an exemplary embodiment, during forming of the first via opening 102, the second via opening 103, the third via opening 401, and the fourth via opening 402, a mask layer is formed on the top surface 101a of the substrate 100 or the top surface 403 of the oxide layer 400. The mask layer includes a pattern corresponding to the top surface of the corresponding metal via structure, and the pattern exposes the top surface of part of the substrate 100 or oxide layer 400. In the etching process, etching is performed from the top surface 101a to the bottom surface 101b of the substrate 100 or from the top surface 403a of the oxide layer 400 to the bottom surface 403b of the oxide layer 400, until a target position is reached.

In an exemplary embodiment, when the first metal via structure 200, the second metal via structure 300, the third metal via structure 500, and the fourth metal via structure 600 are provided, a barrier material may be first deposited on inner sidewalls of the first via opening 102, the second via opening 103, the third via opening 401, and the fourth via opening 402, to project the substrate 100 or the oxide layer 400 in which the via openings are formed, and implement shaping projection for the shapes of the via openings. For example, the barrier material may be titanium, titanium nitride, tantalum, or tantalum-nitride.

In some exemplary embodiments, as shown in FIG. 22 to FIG. 29, when the semiconductor structure is a DRAM, a capacitor 700 is provided on the substrate 100, and after the substrate 100 reaches a certain height through deposition, an array region A1 and a peripheral region A2 are formed. Then, the first metal via structure 200 and the second metal via structure 300 are provided, where the bottom surface 201b of the first metal via structure 200 extends to a bottom of the peripheral region A2 of the DRAM (the bottom surface 101b of the substrate 100). The top surface 201a of the first metal via structure 200 is connected to the bottom surface 501b of the third metal via structure 500, the bottom surface of the second metal via structure 300 may be connected to the capacitor 700, and the top surface 301a of the second metal via structure 300 is connected to the bottom surface 601b of the fourth metal via structure 600.

Figure 22:
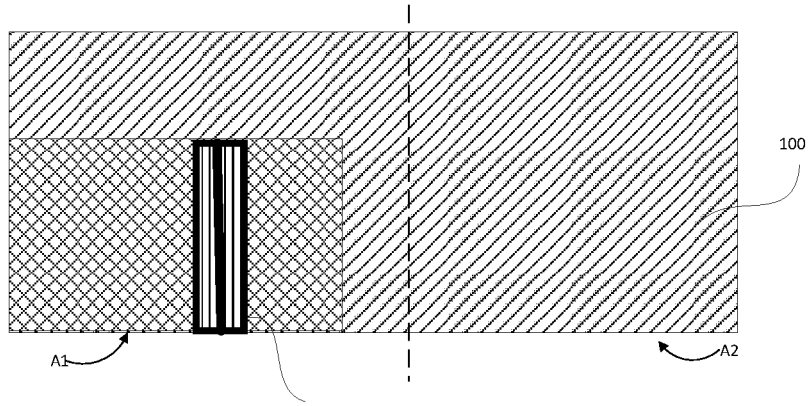
FIG. 22 is a schematic diagram of a semiconductor structure provided with a capacitor in a substrate according to an exemplary embodiment.

In some exemplary embodiments, as shown in FIG. 22, the substrate 100 is formed on the capacitor 700 through deposition. In this way, the obtained substrate 100 has the array region A1 and the peripheral region A2.

Figure 23:
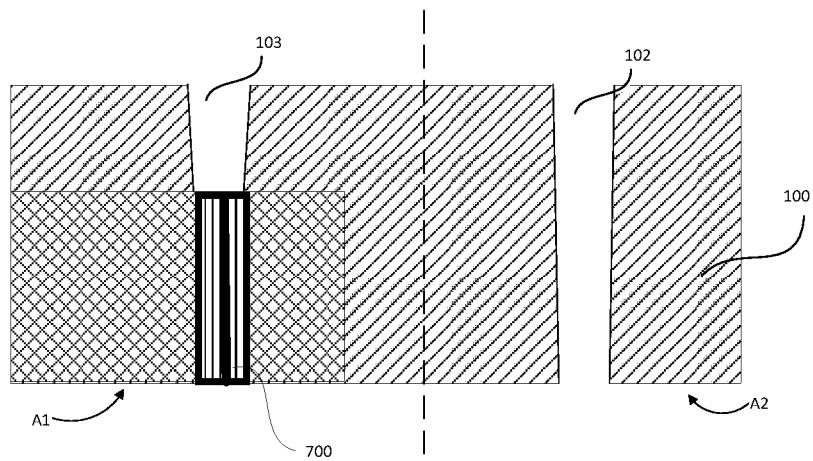
FIG. 23 is a schematic diagram of a semiconductor structure provided with a capacitor according to an exemplary embodiment, where a first via opening and a second via opening are provided in a substrate.

As shown in FIG. 23, the substrate 100 covers the array region A1 and the peripheral region A2, and the array region A1 has the capacitor 700. The first via opening 102 and the second via opening 103 are formed in the substrate 100. The first via opening 102 is provided in the peripheral region A2, and the first via opening 102 penetrates from the top surface 101a to the bottom surface 101b of the substrate 100; the second via opening 103 is provided in the array region A1, and the second via opening 103 extends to the capacitor 700.

Figure 24:
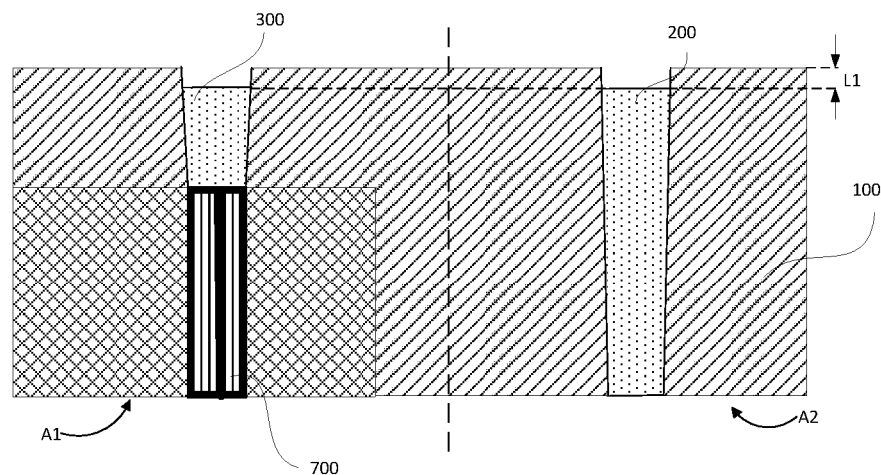
FIG. 24 is a schematic diagram of a semiconductor structure provided with a capacitor after grinding of a first metal layer according to an exemplary embodiment.

As shown in FIG. 24, the first via opening 102 and the second via opening 103 are each filled with a metal layer, where the metal layers may be made of a same metal. For example, the metal layers are both formed by growing tungsten. Then, the metal layers are processed through chemical mechanical polishing, to remove the metal layer on the top surface 101a of the substrate 100. Top surfaces of the obtained metal layers in the first via opening 102 and the second via opening 103 (the top surface 201a of the first metal via structure 200 and the top surface 301a of the second metal via structure 300) each have a certain height difference L1 with the top surface 101a of the substrate 100. In other exemplary embodiments, the top surfaces of the metal layers in the first via opening 102 and the second via opening 103 may have different heights.

Figure 25:
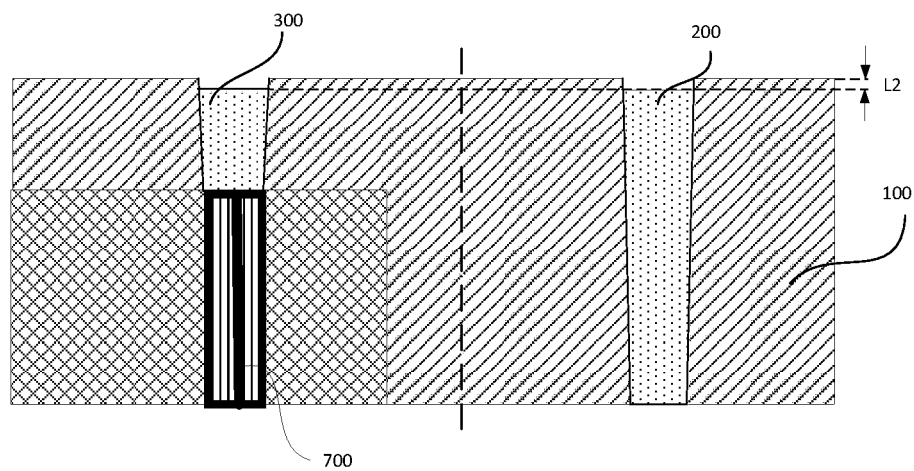
FIG. 25 is a schematic diagram of a semiconductor structure provided with a capacitor after a first process according to an exemplary embodiment.

As shown in FIG. 25, the first process is performed on the semiconductor structure obtained through chemical mechanical polishing. This process can quickly reduce the height differences between the top surface 101a of the substrate 100 and the top surfaces of the metal layers in the first via opening 102 and the second via opening 103 after the chemical mechanical polishing (the top surface 201a of the first metal via structure 200 and the top surface 301a of the second metal via structure 300) to L2.

Figure 26:
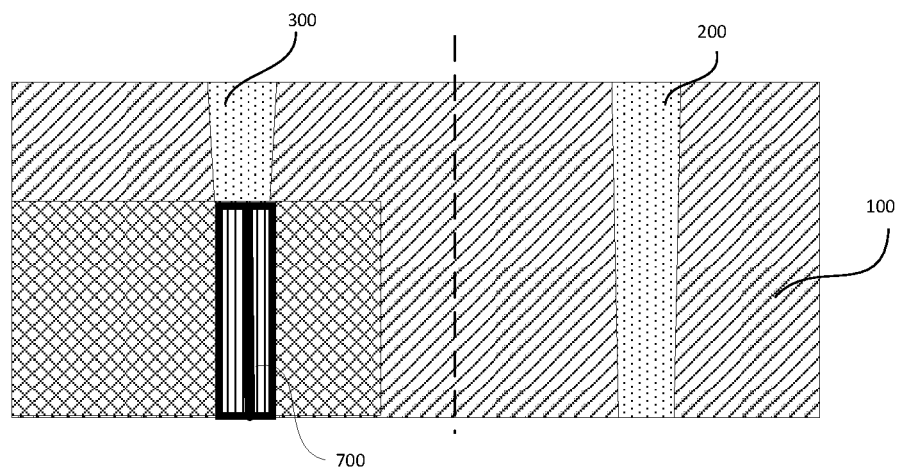
FIG. 26 is a schematic diagram of a semiconductor structure provided with a capacitor as well as a first metal via structure and a second metal via structure according to an exemplary embodiment.

As shown in FIG. 26, the second process is performed on the semiconductor structure obtained after the first process. This process can reduce the height differences between the top surface 101a of the substrate 100 and the top surfaces of the metal layers in the first via opening 102 and the second via opening 103 after the chemical mechanical polishing from L1 to L2, and then to 0. That is, the top surface 101a of the substrate 100 is made flush with the top surface 201a of the first metal via structure 200 and the top surface 301a of the second metal via structure 300. The top surface 201a and the top surface 301a of the first metal via structure 200 and second metal via structure 300 formed in this step are flush with each other. In other exemplary embodiment, the top surface 201a and the top surface 301a of the first metal via structure 200 and second metal via structure 300 formed in this step may have a certain height difference.

Figure 27:
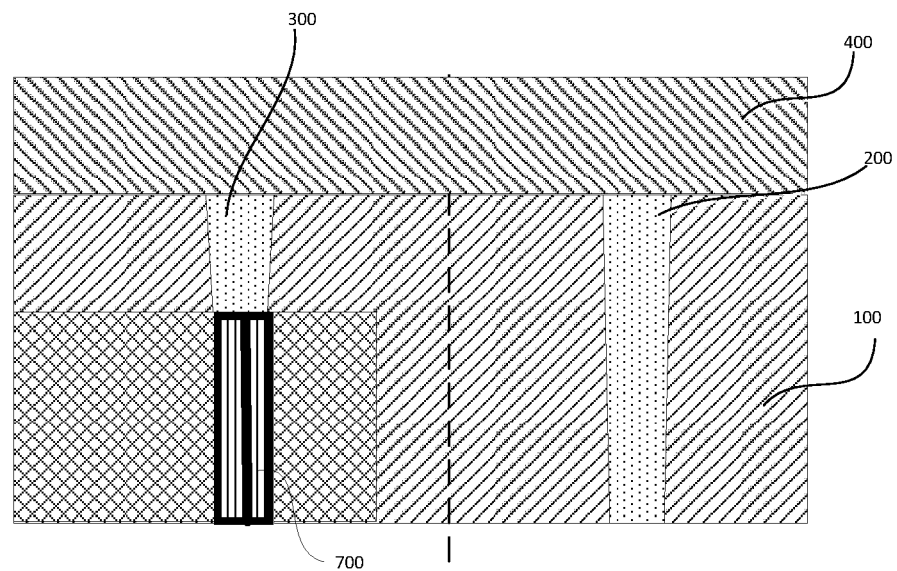
FIG. 27 is a schematic diagram of a semiconductor structure provided with a capacitor according to an exemplary embodiment, where an oxide layer is provided in a substrate.

As shown in FIG. 27, the semiconductor structure obtained after the second process is further processed. An oxide layer 400 is deposited on the top surface 101a of the substrate 100, where the oxide layer 400 covers the top surface 101a of the substrate 100, the top surface 201a of the first metal via structure 200, and the top surface 301a of the second metal via structure 300.

Figure 28:
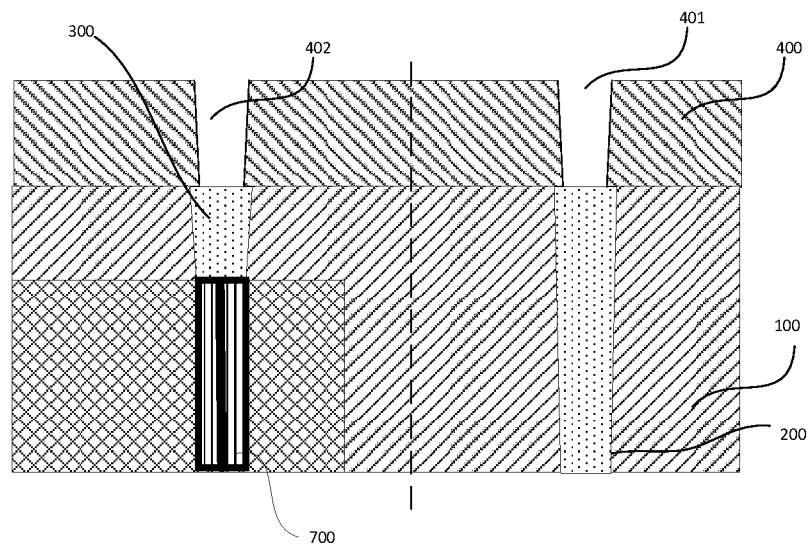
FIG. 28 is a schematic diagram of a semiconductor structure provided with a capacitor according to an exemplary embodiment, where a third via opening and a fourth via opening are provided in an oxide layer.

As shown in FIG. 28, via openings are provided in the oxide layer 400 deposited on the substrate 100 to form a third via opening 401 and a fourth via opening 402, where the third via opening 401 corresponds to the first metal via structure 200, and the fourth via opening 402 corresponds to the second metal via structure 300.

Figure 29:
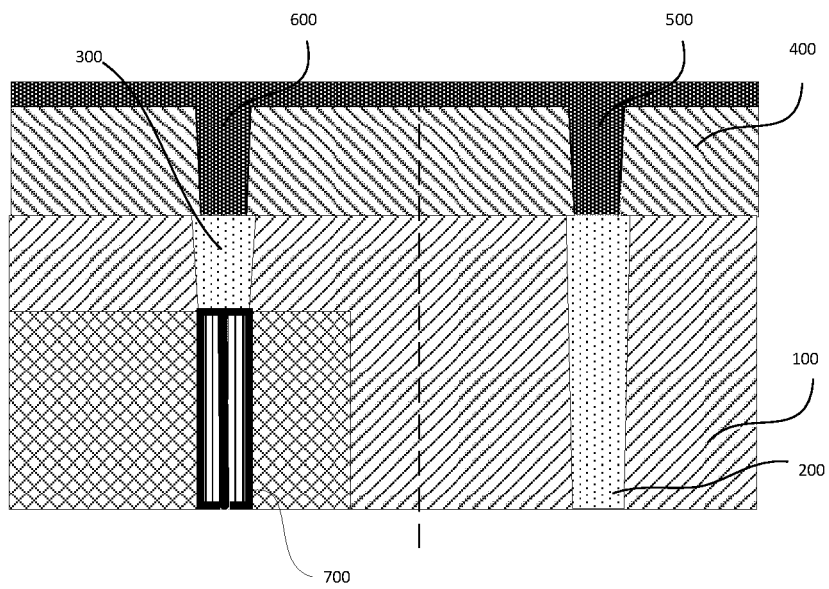
FIG. 29 is a schematic diagram of a semiconductor structure provided with a capacitor according to an exemplary embodiment, where a third metal via structure and a fourth metal via structure are provided in an oxide layer.

As shown in FIG. 29, the semiconductor structure shown in FIG. 29 is processed. A third metal via structure 500 is provided in the third via opening 401, and a fourth metal via structure 600 is provided in the fourth via opening 402.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the manufacturing method thereof provided by the embodiments of the present disclosure, a first metal via structure is provided in a substrate, and corresponding processing is performed on the first metal via structure and the substrate, such that a top surface of the first metal via structure is flush with a top surface of the substrate, thereby improving the uniformity of resistance in a metal interconnect layer. When multiple layers of devices are set, the metal interconnect layer obtained through this manufacturing method can ensure reliable electrical connections to devices in a neighboring layer.

The invention claimed is:

1. A manufacturing method of a semiconductor structure, comprising:
    providing a substrate;
    forming a first via opening, wherein the first via opening extends downward along a top surface of the substrate;
    forming a first metal layer, wherein the first via opening is filled with the first metal layer that covers the top surface of the substrate;
    removing the first metal layer on the top surface of the substrate, wherein the top surface of the substrate is higher than a top surface of the remaining first metal layer;
    removing the substrate with a preset height by a first process and a second process sequentially, such that the top surface of the remaining substrate is flush with the top surface of the remaining first metal layer; and
    forming a first metal via structure by the remaining first metal layer.

2. The manufacturing method of a semiconductor structure according to claim 1, wherein the first process comprises a wet etching process; and the second process comprises a dry etching process.

3. The manufacturing method of a semiconductor structure according to claim 2, wherein the removing the substrate with a preset height by the first process and the second process sequentially, such that the top surface of the remaining substrate is flush with the top surface of the remaining first metal layer comprises:
    etching the top surface of the substrate by a hydrofluoric acid solution with a preset dilution ratio in the wet etching process, such that a height difference between the top surface of the substrate and the top surface of the first metal layer is within a preset range; and
    etching the top surface of the substrate by a mixed gas of hydrogen fluoride and ammonia in the dry etching process, such that the top surface of the substrate is flush with the top surface of the first metal layer.

4. The manufacturing method of a semiconductor structure according to claim 3, wherein the preset range is 2 nm to 3 nm.

5. The manufacturing method of a semiconductor structure according to claim 3, wherein a preparation method of the hydrofluoric acid solution with the preset dilution ratio comprises: mixing a hydrofluoric acid solution with a concentration of 49% and water at a volume ratio of 1:100 to 1:500, wherein
    a flow rate of the hydrogen fluoride is 200 sccm to 300 sccm, and a flow rate of the ammonia is 100 sccm to 160 sccm.

6. The manufacturing method of a semiconductor structure according to claim 1, the method further comprises:
    forming a second metal via structure, wherein the second metal via structure is provided in the substrate, and a height difference between a top surface of the second metal via structure and the top surface of the first metal via structure is less than or equal to a preset height difference.

7. The manufacturing method of a semiconductor structure according to claim 6, wherein the forming a second metal via structure comprises:
   forming a second via opening, wherein the second via opening extends downward along the top surface of the substrate;
   forming a second metal layer, wherein the second via opening is filled with the second metal layer that covers the top surface of the substrate;
   removing the second metal layer on the top surface of the substrate, wherein the top surface of the substrate is higher than a top surface of the remaining second metal layer, and a height difference between the top surface of the remaining second metal layer and the top surface of the first metal via structure is less than or equal to the preset height difference; and
   forming the second metal via structure by the remaining second metal layer.

8. The manufacturing method of a semiconductor structure according to claim 6, the method further comprises:
   forming an oxide layer, wherein the oxide layer covers the top surface of the substrate, the top surface of the first metal via structure, and the top surface of the second metal via structure; and
   forming a third metal via structure, wherein the third metal via structure is provided in the oxide layer, and a bottom surface of the third metal via structure is in contact with the top surface of the first metal via structure.

9. The manufacturing method of a semiconductor structure according to claim 8, wherein projection of the top surface of the first metal via structure on the substrate is larger than projection of the bottom surface of the third metal via structure on the substrate.

10. The manufacturing method of a semiconductor structure according to claim 8, the method further comprises:
    forming a fourth metal via structure, wherein the fourth metal via structure is provided in the oxide layer, and a bottom surface of the fourth metal via structure is in contact with the top surface of the second metal via structure.

11. The manufacturing method of a semiconductor structure according to claim 10, wherein projection of the top surface of the second metal via structure on the substrate is larger than projection of the bottom surface of the fourth metal via structure on the substrate.

12. The manufacturing method of a semiconductor structure according to claim 10, wherein materials of the first metal via structure and the second metal via structure comprise tungsten; and materials of the third metal via structure and the fourth metal via structure comprise copper.

13. A semiconductor structure, comprising:
    a substrate;
    a first metal via structure, wherein the first metal via structure is provided in the substrate, and a top surface of the first metal via structure is flush with a top surface of the substrate, wherein the top surface of the first metal via structure is made flush with the top surface of the substrate through at least a first process and a second process;
    a second metal via structure, wherein the second metal via structure is provided in the substrate, and a height difference between a top surface of the second metal via structure and the top surface of the first metal via structure is less than or equal to a preset height difference;
    an oxide layer, wherein the oxide layer covers the top surface of the substrate, the top surface of the first metal via structure, and the top surface of the second metal via structure; and
    a third metal via structure, wherein the third metal via structure is provided in the oxide layer, and a bottom surface of the third metal via structure is in contact with the top surface of the first metal via structure.

14. The semiconductor structure according to claim 13, wherein projection of the top surface of the first metal via structure on the substrate is larger than projection of the bottom surface of the third metal via structure on the substrate.

15. The semiconductor structure according to claim 13, the semiconductor structure further comprises:
    a fourth metal via structure, wherein the fourth metal via structure is provided in the oxide layer, and a bottom surface of the fourth metal via structure is in contact with the top surface of the second metal via structure.

16. The semiconductor structure according to claim 15, wherein projection of the top surface of the second metal via structure on the substrate is larger than projection of the bottom surface of the fourth metal via structure on the substrate.

17. The semiconductor structure according to claim 15, wherein materials of the first metal via structure and the second metal via structure comprise tungsten; and materials of the third metal via structure and the fourth metal via structure comprise copper.

\* \* \* \* \*